United States Patent [19]

Hartmann et al.

[11] Patent Number: 4,643,963
[45] Date of Patent: Feb. 17, 1987

[54] PHOTOPOLYMERIZABLE RECORDING MATERIALS CONTAINING CYCLIC PENTADIENES FOR THE PRODUCTION OF PRINTING PLATES, AND THE PRODUCTION OF PRINTING PLATES USING THESE RECORDING MATERIALS

[75] Inventors: Heinrich Hartmann, Limburgerhof; Gerhard Hoffmann, Otterstadt; Hellmut Buensch, Norderstedt; Reiner Hofmann, Ludwigshafen, all of Fed. Rep. of Germany

[73] Assignee: BASF Aktiengesellschaft, Fed. Rep. of Germany

[21] Appl. No.: 666,906

[22] Filed: Oct. 31, 1984

[30] Foreign Application Priority Data

Nov. 3, 1983 [DE] Fed. Rep. of Germany ....... 3339815

[51] Int. Cl.$^4$ .......................... G03C 1/68; G03C 5/16; G03F 1/02; C08F 8/00
[52] U.S. Cl. .................................. 430/286; 430/907; 430/908; 430/288; 430/287; 430/325; 430/330; 430/328; 430/300; 522/95; 522/117; 522/126; 522/129; 522/149
[58] Field of Search ............... 430/907, 908, 288, 287, 430/286, 325, 330, 328, 300; 522/121, 95, 117, 126, 129, 149

[56] References Cited

U.S. PATENT DOCUMENTS

| | | |
|---|---|---|
| 3,255,004 | 6/1966 | Thommes ........................ 430/328 X |
| 3,467,523 | 9/1969 | Seidel et al. ..................... 430/286 X |
| 4,023,973 | 5/1977 | Imaizumi et al. .................. 430/286 |
| 4,064,199 | 12/1977 | Nishikawa ....................... 522/149 X |
| 4,085,085 | 4/1978 | Tsuchiya et al. .................... 522/149 |
| 4,254,234 | 3/1981 | Goto ............................. 522/121 X |
| 4,275,142 | 6/1981 | Hosaka et al. .................. 430/300 X |
| 4,431,723 | 2/1984 | Proskow ............................. 430/286 |
| 4,446,220 | 5/1984 | Proskow ............................. 430/286 |

FOREIGN PATENT DOCUMENTS 57-11338  1/1982  Japan ................................. 430/286

OTHER PUBLICATIONS

Gessner G. Hawley, *The Condensed Chemical Dictionary*, 10th edition, Van Nostrand Reinhold Company, New York, N.Y., 1981, p. 759.
Julius Grant, ed, *Hackh's Chemical Dictionary*, Fourth edition, Mc-Graw-Hill Book Company, New York, N.Y., 1969, p. 473.

*Primary Examiner*—John E. Kittle
*Assistant Examiner*—Cynthia Hamilton
*Attorney, Agent, or Firm*—Keil & Weinkauf

[57] ABSTRACT

For the production of printing plates, in particular lithographic printing plates by exposing a photopolymerizable recording material imagewise to actinic light and then effecting development with an aqueous alkaline developer, it is proposed to use photopolymerizable recording materials possessing a photopolymerizable copying layer (L) applied on a dimensionally stable base, where, in addition to containing ethylenically unsaturated photopolymerizable low molecular weight compounds, one or more photoinitiators, dyes and/or pigments, and, if required, further additives and/or assistants, the said copying layer (L) also contains, as a binder, one or more oligomeric and/or relatively high molecular weight copolymers which are soluble or dispersible in aqueous alkaline media and are based on cyclic dienes, in particular unsubstituted or substituted cyclopentadiene or unsubstituted or substituted di- or tricyclopentadiene. Preferred copolymers based on these cyclic dienes contain, as further copolymerized building blocks, carboxylic anhydride-containing comonomers, in particular maleic anhydride, and/or comonomers containing free carboxyl groups, in particular maleic acid half esters.

17 Claims, No Drawings

PHOTOPOLYMERIZABLE RECORDING MATERIALS CONTAINING CYCLIC PENTADIENES FOR THE PRODUCTION OF PRINTING PLATES, AND THE PRODUCTION OF PRINTING PLATES USING THESE RECORDING MATERIALS

The present invention relates to photopolymerizable recording materials for the production of printing plates, in particular lithographic printing plates, possessing a photopolymerizable copying layer (L) which is applied on a dimensionally stable base and can be developed with an aqueous medium. The present invention furthermore relates to a process for the production of printing plates, in particular lithographic printing plates, using these recording materials.

Photopolymerizable recording materials which can be washed out with water or aqueous alkaline media and are intended for the production of photopolymeric printing plates, in particular lithographic printing plates, are known. These comprise, on a dimensionally stable base, e.g. a plastic film or a metal sheet, a photopolymerizable copying layer consisting in general of a mixture of a polymeric binder, which is soluble or dispersible in water or aqueous alkaline media, one or more ethylenically unsaturated photopolymerizable monomers and one or more photoinitiators, with or without further additives and/or assistants. Polymeric binders which have been suggested for these copying layers which can be developed with aqueous media are, in particular, polymers containing carboxyl or carboxylic anhydride groups, e.g. (meth)acrylate/(meth)acrylic acid copolymers, styrene/maleic anhydride copolymers or copolymers of styrene with maleic acid half esters (cf. inter alia DE-B-20 27 467, DE-B-20 64 080, DE-A-22 05 146 or EP-A-49 504).

Although the conventional photopolymerizable recording materials which can be developed with an aqueous medium and are intended for the production of printing plates are suitable for many purposes, they do not as yet meet all the requirements set. In particular, very long exposure times are required in order for the fine image elements which are standard in offset printing (for example tonal values below 2% with a screen of 60 L/cm) to be correctly reproduced and permanently anchored on the base. Frequently, the resolving power of these recording materials is also unsatisfactory. Another disadvantage is the sensitivity of the photopolymerized layers toward the washout medium, i.e. the sensitivity to over-washing is high, and this results in a high reject rate during the process for the production of the printing plate. There is therefore a need for further, improved photopolymerizable recording materials for the production of printing plates, which materials can be developed with an aqueous medium.

It is an object of the present invention to provide novel photopolymerizable recording materials for reprography, in particular for the production of lithographic printing plates, which materials can be developed with aqueous media and have, quite generally, good performance characteristics and printing properties. In particular, the recording materials should have low sensitivity to oxygen coupled with high sensitivity to actinic light and very good resolving power, should be capable, after exposure, of being developed in aqueous media, in particular aqueous alkaline media having a relatively low pH, but should nevertheless have low sensitivity to over-washing and high water-resistance, as required in particular in offset printing, and should be capable of being processed to printing plates which withstand long print runs without being damaged.

We have found that this object is achieved by photopolymerizable recording materials which possess a photopolymerizable copying layer (L) which is applied on a base and which, in addition to low molecular weight photopolymerizable compounds, one or more photoinitiators and further additives and, if required, assistants, contains, as a binder, one or more oligomeric and/or relatively high molecular weight copolymers which are based on cyclic dienes and are soluble or dispersible in aqueous alkaline media.

The present invention accordingly relates to photopolymerizable recording materials for the production of printing plates, in particular lithographic printing plates, possessing a photopolymerizable copying layer (L) which is applied on a dimensionally stable base, can be developed with aqueous media and consists of a mixture containing (a) a polymeric binder which is soluble or dispersible in aqueous alkaline media, (b) one or more ethylenically unsaturated photopolymerizable low molecular weight compounds, (c) one or more photopolymerization initiators and (d) one or more dyes and/or pigments, with or without (e) further additives and/or assistants, wherein, in these recording materials, the photopolymerizable copying layer (L) contains, as binder (a), one or more oligomeric and/or relatively high molecular weight copolymers which are based on cyclic dienes, in particular unsubstituted or substituted cyclopentadiene, dicyclopentadiene or tricyclopentadiene, and are soluble or dispersible in aqueous alkaline media.

The present invention furthermore relates to a process for the production of printing plates, in particular lithographic printing plates, using a photopolymerizable recording material possessing a photopolymerizable copying layer (L) applied onto a dimensionally stable base, in which the said layer (L) is exposed imagewise to actinic light, the unexposed parts of the layer (L) are removed with an aqueous developer, and the resulting printing plate is, if required, then dried and post-cured, wherein a novel recording material of the type described above is employed in this process.

The use, according to the invention, of copolymers which are soluble or dispersible in aqueous alkaline media and are based on cyclic dienes, in particular copolymers of this type which contain free carboxylic and/or carboxylic anhyride groups not only permits the production of printing plates possessing very good performance characteristics and printing properties, many of which are improved, but, depending on the type of copolymer of the cyclic dienes which is used as the binder and on the procedure in the process, also permits the properties of the printing plates to be varied simply and in a variety of ways, and hence adapted to the desired use, in particular to the expected load.

The photopolymerizable copying layer (L) which can be developed with aqueous media and is present in the novel recording materials contains, as binder (a), copolymers which are soluble or dispersible in aqueous alkaline media and are based on cyclic dienes, in particular those of the cyclopentadiene type. Examples of monomers of the cyclopentadiene type which are suitable for the synthesis of the copolymers employed according to the invention as binders are cyclopentadiene, dicyclopentadiene, tricyclopentadiene and tetracyclopentadiene and their substitution products, in particular their alkylsubstituted derivatives which contain one or more lower alkyl groups of 1 to 3 carbon atoms, e.g. methyl cyclopentadiene, methyl dicyclopentadiene or methyl tricyclopentadiene. Preferred starting materials for the preparation of the copolymers employed according to the invention are cyclopentadiene, dicyclopentadiene and/or methyl dicyclopentadiene, in particular dicyclopentadiene.

The copolymers employed according to the invention as binder (a) and based on the cyclic dienes, preferably contain, as further copolymerized units, comonomers possessing carboxylic anhydride groups and/or comonomers possessing free carboxyl groups. These are, in particular, $\alpha$, $\beta$-unsaturated dicarboxylic acids, preferably of 4 to 8 carbon atoms, and their anhydrides and/or their half esters. These include maleic acid, fumaric acid, itaconic acid, mucochloric acid and muconic acid and their derivatives, in particular their anhydrides and/or half esters. Particularly preferred copolymers are those which contain maleic anhydride and/or maleic acid half esters as copolymerized units, in addition to the comonomer units of the cyclopentadiene type.

In addition to the monomers of the cyclopentadiene type and the stated comonomers containing carboxyl or carboxylic anhydride groups, the copolymers employed according to the invention as binders can contain further comonomers as copolymerized units. These include, in particular, vinyl aromatics, for example styrene which is unsubstituted or substituted in the side chain or in the nucleus by, for example, alkyl or halogen, e.g. $\alpha$-methylstyrene, o- or p-chlorostyrene, stilbene and the like. In general, the said copolymers incorporate, or contain as copolymerized units, from 95 to 45% by weight of one or more monomers of the cyclopentadiene type, from 5 to 45% by weight of one or more unsaturated dicarboxylic acids and/or their derivatives, in particular the anhydride of an $\alpha$, $\beta$-unsaturated dicarboxylic acid, and from 0 to 30% by weight of further units of other comonomers. These copolymers can be employed, in the photopolymerizable copying layer (L) alone or as a mixture with one another and either in an unmodified or modified form, depending on the spectrum of properties which the novel recording materials, or the printing plates produced from these, are required to possess. Depending on the particular type of copolymer, its mean molecular weight is in general above about 500.

In an embodiment of the invention, the photopolymerizable copying layer (L) contains, as binder (a), an oligomeric copolymer consisting predominantly of one or more cyclopentadiene monomers and the anhydride of an $\alpha$, $\beta$-unsaturated dicarboxylic acid, preferably maleic anhydride, with or without further comonomers, e.g. vinyl aromatics. Here and below, cyclopentadiene monomers are monomers of cyclopentadiene of the abovementioned type, dicyclopentadiene being particularly preferred. Particularly advantageous copolymers of this type consist of from 55 to 95, in particular from 56 to 75%, by weight of one or more cyclopentadiene monomers and from 5 to 45, in particular from 25 to 44%, by weight of the anhydride of an $\alpha$, $\beta$-unsaturated dicarboxylic acid, in particular maleic anhydride. The mean molecular weight of these oligomeric copolymers is in general from about 500 to 1000. They can be prepared by a conventional process, by heating the comonomers together to about 250° C. or higher, in the presence or absence of a free radical catalyst. These oligomeric copolymers are brown products which are readily soluble in many solvents and hence readily processable, and whose softening range is usually from 170° to 280° C. It is very particularly surprising that printing plates whose copying layer contains such oligomeric binders are capable of meeting the high requirements which these plates have to satisfy, particularly in offset printing.

In another, likewise very advantageous, embodiment of the invention, the photopolymerizable copying layer (L) contains, as the binder (a), oligomeric copolymers predominantly consisting of one or more cyclopentadiene monomers and containing half esters of $\alpha$, $\beta$-unsaturated dicarboxylic acids, in particular maleic acid half esters, as comonomer units. These oligomeric copolymers are obtained in a simple manner if the anhydride groups in the above copolymers of cyclopentadiene monomers and $\alpha$, $\beta$-unsaturated dicarboxylic anhydrides, in particular maleic anhydride, are partially esterified with appropriate alcohols, in particular alkanols of 1 to 8 carbon atoms. Particularly interesting copolymers include the oligomeric copolymers which, in addition to a predominant amount of cyclopentadiene monomers, contain both maleic anhydride groups and maleic acid half ester groups as comonomer units. Examples of these are oligomeric copolymers, in particular those having a mean molecular weight of about 500–1000, which are composed of from 55 to 95, in particular from 60 to 80%, by weight of cyclopentadiene monomers, from 0 to 30, in particular from 5 to 30%, by weight of maleic anhydride groups and from 5 to 45, in particular from 5 to 30%, by weight of maleic acid half ester groups.

In a special development of this embodiment of the invention, the binder (a) used comprises copolymers of cyclopentadiene monomers and anhydrides of $\alpha$, $\beta$-unsaturated dicarboxylic acids, some or all, preferably not more than about 60%, of whose anhydride groups are semiesterified with hydroxyl-containing compounds which contain photopolymerizable ethylenic double bonds. Very advantageous copolymers of this type are those whose anhydride groups are semi-esterified with hydroxyl-containing acrylates and/or methacrylates, in particular hydroxyalkyl (meth)acrylates, e.g. 2-hydroxyethyl (meth)acrylate, 2-hydroxypropyl (meth)acrylate, 3-hydroxypropyl (meth)acrylate, butane-1,4-diol mono(meth)acrylate or the mono(meth)acrylates of diethylene glycol, triethylene glycol or tetraethylene glycol, or the like. Particularly advantageous results are obtained using oligomeric copolymers which consist of from 60 to 80% by weight of one or more cyclopentadiene monomers and from 20 to 40% by weight of maleic anhydride, and as much as 60%, in particular from 20 to 60%, of whose maleic anhydride groups have been semi-esterified with hydroxyalkyl (meth)acrylates of the stated type, in particular 2-hydroxyethyl (meth)acrylate and the hydroxypropyl (meth)acrylates. These copolymers likewise preferably have a mean molecular weight of about 500–1000, are also brown and readily soluble, and generally have a softening range below 200° C. By introducing the photopolymerizable double bonds into the copolymer, it is possible to increase the degree of crosslinking and the degree of curing during exposure of the recording materials, or to reduce the amount of low molecular weight photopolymerizable compounds (b).

In another embodiment of the invention, it is also possible to use, as binder (a) in the photopolymerizable copying layers (L), modified copolymers of cyclopentadiene monomers, anhydrides of α, β-unsaturated dicarboxylic acids and/or half esters of the latter, as described above. Such modified products are obtained by, for example, reacting the above oligomeric copolymers of the cyclopentadiene monomers, the anhydride of an α, β-unsaturated dicarboxylic acid, in particular maleic anhydride, and/or the half esters of these acids, in particular maleic acid half ester, with polyfunctional compounds capable of reacting with the anhydride groups or free carboxyl groups. Examples of such polyfunctional compounds for modifying the copolymers are bifunctional or trifunctional alcohols, bifunctional or trifunctional amines and the like. If these polyfunctional compounds are employed in amounts greater than the stoichiometric amount, the resulting copolymers of the stated type contain additional reactive groups, for example hydroxyl groups, amino groups or the like. Care should be taken to ensure that the modification with the polyfunctional compounds is carried out in such a way that the resulting modified copolymers are still soluble or dispersible in aqueous alkaline media.

In yet another, very advantageous development of this novel embodiment, the polymers used as binder (a) for the photopolymerizable copying layer (L) are obtained by reacting the above oligomeric copolymers, obtained from cyclopentadiene monomers, anhydrides of α, β-unsaturated dicarboxylic acids and/or half esters of these acids, with less than the stoichiometric amount of polyfunctional compounds capable of reacting with the anhydride groups or free carboxyl groups of the oligomeric copolymers. Thus, relatively high molecular weight copolymers based on cyclopentadiene monomers, modified with carboxylic acids and also having mean molecular weights of, for example, above 1000 are obtained in a simple manner. Such relatively high molecular weight copolymers of the type under discussion, in which the chains have been lengthened, can readily be prepared by reacting the oligomeric copolymers with the polyfunctional compounds in an inert solvent at elevated temperatures. Particularly suitable polyfunctional compounds are bifunctional or trifunctional alcohols, bifunctional or trifunctional amines and the like. The polyfunctional compounds for the chain-lengthening reaction may also contain further functional groups, e.g. ethylenically unsaturated photopolymerizable radicals. Examples of polyfunctional compounds which are suitable for the modification and chain-lengthening of the oligomeric copolymers are monoethylene glycol, diethylene glycol, triethylene glycol, tetraethylene glycol, polyethylene glycols, in particular those having molecular weights as high as about 500, 1,2-propylene glycol, 1,3-propylene glycol, polypropylene glycols, in particular those having a molecular weight as high as about 500, butanediol, hexanediol, glycerol, neopentylglycol, pentaerythritol, trimethylolpropane, pentaerythritol mono(meth)acrylate, pentaerythritol di(meth)acrylate, trimethylolpropane mono(meth)acrylate, butene-1,4-diol, ethylenediamine, propylene-diamine, 4,4'-diaminodiphenylmethane, 4,4'-(N,N'-dimethyl)-diaminodiphenylmethane, aminoalkanols, such as 2-hydroxyethylamine, and the like.

In addition to the binder (a) of the stated type, the photopolymerizable copying layer (L) contains one or more ethylenically unsaturated photopolymerizable low molecular weight compounds (b). Suitable compounds are in principle any low molecular weight photopolymerizable compounds which are conventionally used for photopolymerizable mixtures and layers, in particular the ethylenically unsaturated photopolymerizable monomers and oligomers having a molecular weight as high as about 5000, in particular as high as about 3000. The said compounds (b) can be monofunctional or polyfunctional, i.e. they can possess one or more ethylenic photopolymerizable double bonds. Usually, the photopolymerizable copying layer (L) contains, as component (b), bifunctional or polyfunctional ethylenically unsaturated photopolymerizable low molecular weight compounds either alone or as a mixture with monofunctional compounds of this type. However, it is also possible in principle for the said layer (L) to contain only monofunctional compounds of the above type, particularly when the copolymers used as binder (a) also contain copolymerized groups possessing photopolymerizable ethylenic double bonds.

Suitable compounds (b) of the stated type, which can be used alone or as a mixture with one another, are allyl and vinyl compounds and, in particular, acrylic and methacrylic acid and their derivatives, very particularly the acrylates and methacrylates. Examples of suitable compounds (b) are the di- and tri(meth)acrylates of ethylene glycol, diethylene glycol, triethylene glycol, polyethylene glycols having a molecular weight as high as about 500, propane-1,2-diol, propane-1,3-diol, butane-1,4-diol, 1,1,1-trimethylolpropane, neopentylglycol (2,2-dimethylpropanediol), glycerol and pentaerythritol, glucose tri- and tetra(meth)acrylate, the monoacrylates and monomethacrylates of the stated diols and polyols, e.g. ethylene glycol mono(meth)acrylate and di-, tri- and tetraethylene glycol mono(meth)acrylate, the acrylates and methacrylates of monoalkanols, in particular those of 1 to 20 carbon atoms, and monomers which possess 2 or more ethylenically unsaturated bonds and contain urethane and/or amide groups, for example the low molecular weight urethane (meth)acrylates prepared from aliphatic diols of the above type, organic diisocyanates and hydroxyalkyl (meth)acrylates. Examples of further compounds are divinylethyleneurea, divinylpropyleneurea, N-vinylpyrrolidone, N-vinylcaprolactam, vinyl acetate, vinyl propionate, N-methylol (meth)acrylamide, the bisether of ethylene glycol and N-methylol(meth)acrylamide, vinyl carbamates, N-(p-diphenylamine)acrylamide, vinylmethylacetamide, bisacrylamidoacetic acid, glyoxalbisacrylamide and others. As is obvious to the skilled worker, the ethylenically unsaturated photopolymerizable low molecular weight compounds (b) which are chosen should be compatible with the binders (a) employed.

The photopolymerizable copying layer (L) of the novel recording materials furthermore contains one or more photopolymerization initiators. Suitable photoinitiators or photoinitiator systems are those which are conventionally used for photopolymerizable recording materials, in particular for the production of offset printing plates or resist layers. Examples of suitable photoinitiators are benzoin, benzoin derivatives, e.g. benzoin ethers, substituted benzoins, substituted benzoin derivatives, e.g. substituted benzoin ethers, benzils, in particular benzil ketals, acylphosphine oxide compounds, in particular compounds of the benzophenone type and its derivatives, e.g. benzophenone, 4,4'-dimethylaminobenzophenone, 4,4'-diethylaminobenzophenone, derivatives of Michler's ketone, 4,4'-dichlorobenzophenone, etc., and mixtures of these; anthraquinones, e.g. 2-ethylanthraquinone, tert.-butylanthraquinone, etc.; bisimidazole derivatives, e.g. 2,4,5-triarylimidazole dimers; 2-chlorothioxanthone, and the acridine and phenazine derivatives which are effective as photoinitiators. Examples of initiator systems are combinations of the stated initiators with sensitizing assistants, in particular tertiary amines. Particular examples of such initiator systems are combinations of benzophenone or benzophenone derivatives with tertiary amines, e.g. triethanolamine, or Michler's ketone, or mixtures of 2,4,5-triarylimidazole dimers and 2-mercaptobenzoquinazole, leuco crystal violet, tris-(4-diethylamino-2-methylphenyl)-methane and the like. The photoinitiators and photoinitiator systems are adequately described in the relevant literature, and the skilled worker is familiar with their selection.

The photopolymerizable copying layer (L) of the novel recording materials contains dyes and/or pigments as a further component (d) and these can both act as contrast agents and have a strengthening effect in the layer. Examples of suitable substances are dyes as described in U.S. Pat. Nos. 3,218,167 and 3,884,693. Examples of particularly suitable substances are Victoria Sky Blue FGA, Victoria Sky Blue BO (C.I. 42 595), Malachite Green, Crystal Violet, Victoria Blue B (C.I. 44 045), Rhodamine 6 GDN (C.I. 45 160), Fat Red 5 B (C.I. 26 125), Neozapon Blue FLE (C.I. Solvent Blue 70), Brilliant Blue Salt Acetate, Samaron Navy Blue, Orasol Blue GN, Renol Blue B2G (C.I. 74 160) and Zapon Fast Fire Red B (C.I. 13 900:1). In order to increase the image contrast after exposure, it is possible to use, for example, dyes such as Metanil Yellow (C.I. 13 065), Methyl Orange (C.I. 13 025) or phenylazodiphenylamine.

It is frequently advantageous if the photopolymerizable copying layer (L) of the novel recording materials also contains further additives and/or assistants (e) for improving and/or modifying the general properties of the recording materials or the printing plates produced from these. These include, in particular, thermal polymerization inhibitors, e.g. hydroquinone, hydroquinone derivatives, 2,6-di-tert.-butyl-p-cresol, nitrophenols, N-nitrosamines, such as N-nitrosodiphenylamine, or the salts, in particular the alkali metal or aluminum salts, of N-nitrosocyclohexylhydroxylamine. The copying layer (L) may furthermore contain sensitometric regulators as are known per se and described in the literature. These include, for example, 9-nitroanthracene, 10,10'-bisanthrones, phenazinium, phenoxazinium, acridinium and phenotiazinium dyes, 1,3-dinitrobenzenes and the like. Examples of other suitable additives and/or assistants are fillers, reinforcing agents and further binders which improve the mechanical properties; the last-mentioned component should be compatible with the other components of the photopolymerizable copying layer (L).

In a particular embodiment of the invention, the photopolymerizable copying layer (L) can furthermore contain, as additives, compounds which, under the action of heat and/or light, are capable of undergoing crosslinking reactions with the anhydride groups or carboxyl groups of the copolymers present as binder (a). Examples of such compounds which have a crosslinking effect under the action of heat and/or light are di- and polyepoxides and blocked di- and polyisocyanates. Examples of suitable di- and polyepoxides are the reaction products of epichlorohydrin with polyols or with polyamines, polyolefin epoxides, epoxidized polybutadiene, epoxy resins of the novolak type, glycidyl esters of unsaturated carboxylic acids, in particular of acrylic or methacrylic acid, and others. Examples of blocked di- and polyisocyanates are the reaction product of 1 mole of trimethylolpropane, 3 moles of 2,4-diisocyanatotoluene and 3 moles of phenol; the isocyanurate derivative obtained by trimerization of the reaction product of 2,4-diisocyanatotoluene and cresol; and the blocked isocyanates prepared from toluylene diisocyanate, trimethylolpropane, butanediol and cresol. By adding these compounds which have a crosslinking effect, it is possible to achieve additional crosslinking and curing in the imagewise exposed and developed copying layer (L) after the actual production of the printing plate, and hence to vary and modify the properties, in particular the stability, of the printing plates. In order to ensure that the recording materials will have a long shelf life, it is advantageous to employ crosslinking compounds which undergo a crosslinking reaction with the reactive groups of the copolymers (a) only at elevated temperatures, for example above 60° C., preferably above 80° C. It may be advantageous if additional catalysts which can be activated by light and/or heat are present in the photopolymerizable copying layer (L) to accelerate this crosslinking reaction. Examples of such catalysts which can be activated thermally and/or photochemically include diazonium salts, onium salts of elements of main groups V, VI and VII of the periodic table, sulfoxonium salts and pyrrilium salts (cf. for example U.S. Pat. Nos. 3,205,157 and 3,708,296, DE-A-25 18 656, DE-A-25 18 652, DE-A-29 04 626, EP-A-22 081, EP-A-35 696 and EP-A-74 073).

The photopolymerizable copying layer (L) of the novel recording materials contains in general
(a) from 40 to 90% by weight of an oligomeric and/or polymeric binder consisting of one or more copolymers which are based on cyclic dienes and are soluble or dispersible in aqueous alkaline media,
(b) from 8 to 55% by weight of one or more ethylenically unsaturated photopolymerizable low molecular weight compounds of the stated type,
(c) from 0.3 to 12% by weight of one or more photopolymerization initiators,
(d) from 0.005 to 0.5% by weight of one or more dyes and/or pigments and
(e) from 0 to 20% by weight of further additives and/or assistants which improve or modify the general properties of the recording materials or of the printing plates produced from these, the percentages in each case being based on the dry weight of the entire copying layer (L).

Suitable bases for the photopolymerizable copying layer (L) are the dimensionally stable rigid or, preferably, flexible bases which are conventionally used as such and consist of, for example, plastic films, e.g. polyester films, or of metals. Particularly advantageous bases are metallic bases consisting of, for example, magnesium, zinc, copper, mechanically, chemically and/or electrochemically roughened aluminum, anodized aluminum, steel, etc. Particularly preferred bases for the production of lithographic printing plates are aluminum sheets which have been pretreated in the conventional manner for this purpose, for example by mechanical, chemical or electrochemical roughening, with or without subsequent anodic oxidation. Further treatment of this base material with, for example, a polyvinylphosphonic acid, an alkali metal silicate, a phosphate, a hexafluorozirconate, a chromate, a borate, a polyacrylamide or a cellulose derivative is advantageous.

The novel photopolymerizable recording materials can be prepared in a conventional manner, for example by dissolving the components of the photopolymerizable copying layer (L) in a suitable solvent or solvent mixture, and applying this solution in the desired thickness onto the base by casting, dipping, spraying or another conventional application technique. The solvent is then removed in a conventional manner, and the said layer (L) is dried. Suitable solvents for the preparation of the said layer (L) include tetrahydrofuran, dioxane, dimethoxyethane, diglycol dimethyl ether, methylglycol, ethylglycol, diacetone alcohol, methyl isobutyl ketone, methylglycol acetate and others. The thickness of the dry photopolymerizable copying layer (L) is in general from 0.5 to 75, preferably from 0.8 to 6, $\mu$m, depending on the intended use. For the production of lithographic printing plates, the thickness of the dry layer (L) is usually about 0.5–12, preferably about 0.8–2.5, $\mu$m.

The photopolymerizable copying layer (L) of the novel recording materials can advantageously be provided with a further cover sheet, in particular one about 2–6 $\mu$m thick. This cover sheet, which serves primarily to protect the said layer (L) during storage and handling of the photopolymerizable recording materials, either can be peeled off from the said layer (L) or, advantageously, is transparent and is soluble in the solvent which is used for developing the imagewise exposed copying layer (L). Cover sheets which have proven particularly useful are those consisting of polyvinyl alcohols or polyvinyl alcohol derivatives.

Printing plates, in particular lithographic printing plates, can be produced from the novel photopolymerizable recording materials by a conventional method. For this purpose, the photopolymerizable copying layer (L) is first exposed imagewise to actinic light. Imagewise exposure can be carried out with diffuse light, through an image-bearing transparency, for example a photographic negative or positive, or by means of an imagewise modulated light beam, e.g. an imagewise modulated laser beam. Light sources which are suitable for imagewise exposure of the photopolymerizable copying layer (L) are the conventional sources of actinic light, e.g. UV fluorescence tubes, high pressure, medium pressure or low pressure mercury lamps, superactinic fluorescent tubes, pulsed xenon lamps, metal halide-doped lamps, carbon arc lamps, etc., as well as UV lasers, argon lasers and the like. The wavelength emitted by the light source should be in general from 230 to 450 nm, preferably from 300 to 420 nm, and should in particular match the characteristic absorption of the photoinitiator present.

Imagewise exposure to actinic light initiates photopolymerization in the exposed areas of the copying layer (L), and this photopolymerization leads to crosslinking and hence to a differentiation between the solubilities of the exposed and unexposed areas of the layer. After imagewise exposure, the printing plate is developed with an aqueous alkaline developer, by washing out the unexposed, non-crosslinked parts of the layer. Development of the printing plate can be carried out by spraying, washing, brushing, etc. with the developer. Because the exposed parts of the copying layer (L) are highly resistant to water, it is possible to use harsher washout conditions than in the case of conventional recording materials of this type, without this having an adverse effect on the printing plate produced. Particularly suitable developers for the novel recording materials are aqueous alkaline solutions which have a pH of from 8 to 14, preferably from 9 to 12, and contain buffer salts, e.g. water-soluble alkali metal phosphates, silicates, borates, carbonates, acetates or benzoates. Wetting agents, preferably anionic wetting agents, and, if required, water-soluble polymers may also be present as further components of the developer. Although the novel recording materials are washed out in general with purely aqueous developers, it may be advantageous in certain cases to add small amounts of an organic solvent which is miscible with the aqueous developer.

After the washout procedure, the resulting printing plates are dried in a conventional manner, if necessary at as high as 120° C. In some cases, it is advantageous if the printing plate obtained is then postexposed uniformly to actinic light in order to increase the strength of the plate. In the embodiment of the novel recording materials where the photopolymerizable copying layer (L) also contains, as additives, compounds capable of undergoing a crosslinking reaction with the functional groups of the copolymer (a) under the action of heat and/or light, production of the printing plate can be followed by a post-curing and crosslinking step. Depending on the type of crosslinking agent used and on any activatable catalysts which may concomitantly be used for this crosslinking reaction, this post-curing and crosslinking can either be induced by exposure to actinic light or carried out by heating the printing plate in general to above 60° C., in particular from 80° to about 220° C. In this connection, heating of the printing plate can be carried out, for example, by bringing the copying layer (L) into contact with warm air, for example in an oven, or by irradiation with heat radiation, for example using an infrared lamp. By varying the heating temperature and in particular the duration of heating, the hardness, strength and other properties of the printing plate can be varied, and adjusted by the desired amount, according to the particular intended use.

The recording materials according to the invention possess advantageous and well-balanced properties and have, in particular, good exposure characteristics, i.e. comparatively short exposure times can be used and very high resolution is obtained. Fine image elements, too, are correctly reproduced and have the strength required for printing. Compared with conventional recording materials of this type which contain, for example, styrene/maleic anhydride copolymers as binders in the photopolymerizable layer, the novel recording materials are substantially less sensitive to oxygen, which facilitates handling and processing. Inspite of the fact that the imagewise exposed recording materials can be washed out with aqueous developers, the exposed parts of the recording materials are highly water-resistant. The danger of overwashing during development of the printing plates is substantially reduced compared with the prior art products. The printing plates, in particular lithographic printing plates, produced using the novel recording materials possess good mechanical strength and chemical stability and permit long print runs while giving exact reproduction.

The Examples which follow illustrate the invention. Parts and percentages are by weight, unless stated otherwise.

EXAMPLE 1

An oligomer having a mean molecular weight of about 820 and a K value of 9.8 was prepared from 75% of dicyclopentadiene and 25% of maleic anhydride. A solution of 58 parts of this oligomer, 33 parts of trimethylolpropane diacrylate, 6 parts of benzophenone, 2 parts of Michler's ketone and 1 part of Victoria Sky Blue in 900 parts of tetrahydrofuran was applied onto an electrochemically roughened and anodically oxidized aluminum sheet for offset plates in such a way that evaporation of the solvent and drying of the layer for 15 minutes at 70° C. gave a 1.6 μm thick dry layer.

The recording material prepared in this manner was exposed imagewise to actinic light in an offset exposure unit with a 5 kW lamp, and was then washed out with an aqueous alkaline solution having a pH of 11.2. The resulting offset printing plate withstood a print run of 25,000 prints without undergoing the slightest damage, even to very fine image elements (screen: 2% tonal value, 60 L/cm).

EXAMPLE 2

The procedure described in Example 1 was followed, except that in this case the oligomer used was obtained from 60% of dicyclopentadiene and 40% of maleic anhydride and had a mean molecular weight of 670 and a K value of 9.6. This recording material was used to produce an offset printing plate by the procedure described in Example 1, and the plate obtained gave equally good printing results. However, it was possible to reduce the washout time during its production by 40%.

EXAMPLE 3

80 parts of an oligomer obtained from 65% of dicyclopentadiene and 35% of maleic anhydride and having a mean molecular weight of about 750 were dissolved in 500 parts by volume of diglycol dimethyl ether, and 10 parts of ethylene glycol were then added. The mixture was heated at 140° C. for 4 hours and then cooled, after which the solution was slowly added dropwise to 3000 parts by volume of water, a brownish polymer being precipitated. After this had been separated off and dried, it had a softening range above 270° C. The softening range of the starting oligomer before the reaction with ethylene glycol was about 230° C.

The resulting dicyclopentadiene/maleic anhydride copolymer modified with ethylene glycol was used to produce an offset printing plate by the method described in Example 1. The resulting plate had excellent properties.

EXAMPLE 4

100 parts of an oligomer obtained from 60% of dicyclopentadiene and 40% of maleic anhydride and having a mean molecular weight of 670, 2 parts of hydroquinone monomethyl ether and 45 parts of pentaerythritol diacrylate were dissolved in 500 parts of diglycol dimethyl ether, the solution was stirred for 8 hours at 90° C. and the resulting polymer was then precipitated in water, as a brown powder.

55 parts of the resulting polymeric reaction product of the dicyclopentadiene/maleic anhydride copolymer, 36 parts of glycolamol, 3 parts of N-vinylcaprolactam, 4 parts of benzosuberone, 2.5 parts of Michler's ketone, 50 ppm of Safranine T, 0.5 part of anethole, 0.2 part of hydroquinone monomethyl ether and 0.7 part of Victoria Sky Blue were dissolved in 1000 parts of ethylene glycol. This solution was filtered and then applied onto an electrically roughened, anodically oxidized aluminum sheet after-treated with wet steam, application being carried out so as to give a dry layer having a weight per unit area of about 90 mg/dm$^2$. The photopolymerizable layer was dried and then covered with a 2.5 μm thick layer of polyvinyl alcohol (88% hydrolyzed).

The recording material thus obtained was exposed imagewise to a 5 kW gallium-doped high pressure mercury lamp at a distance of 1 m. The image-bearing transparency used was a standard negative for offset exposure (introduced by FOGRA). The exposure time was 8 seconds. Washing out was then effected with a commercial aqueous alkaline developer whose pH had been reduced to 11.5 by dilution with water. The resulting printing plate reproduced the image-bearing negative exactly, the reproduction being faithful to the original. 12 step wedges were reproduced, negative and positive 4 μm lines also being obtained.

Using the offset printing plate obtained in this manner, 20,000 prints were then produced without any signs of wear being observed on the plate.

We claim:

1. A photopolymerizable recording material for the production of printing plates possessing a photopolymerizable copying layer (L) which is applied on a dimensionally stable base, developable with an aqueous medium, said photopolymerizable copying layer (L) being formed of a mixture containing
   (a) one or more copolymers of cyclopentadiene monomers which copolymers are soluble or dispersible in an aqueous alkaline media,
   (b) one or more ethylenically unsaturated photopolymerizable low molecular weight compounds,
   (c) one or more photopolymerizable initiators, and
   (d) one or more dyes and/or pigments.

2. A photopolymerizable recording material as claimed in claim 1, wherein the copolymer contains, as copolymerized cyclopentadiene monomers, a member selected from the group consisting of cyclopentadiene, dicyclopentadiene, tricyclopentadiend and methyl dicyclopentadiene or mixtures thereof.

3. A photopolymerizable recording material as claimed in claim 2, wherein, in addition to containing the the cyclopentadiene monomers, the copolymer contains α, β-unsaturated dicarboxylic acids, their anhydrides and/or their half esters as copolymerized comonomers.

4. A photopolymerizable recording material as claimed in claim 3, which contains, as component (a), an oligomeric copolymer which contains, as copolymerized units, a predominant amount of one or more cyclopentadiene monomers, as well as the anhydride of an α, β-unsaturated dicarboxylic acid.

5. A photopolymerizable recording material as claimed in claim 4, wherein the copolymer consists of from 55 to 95% by weight of polymerized dicyclopentadiene units and from 5 to 45% by weight of units of polymerized maleic anhydride.

6. A photopolymerizable recording material as claimed in claim 1, which contains, as component (a), a copolymer which contains, as copolymerized units, a predominant amount of one or more cyclopentadiene monomers, as well as one or more half esters of an α,β-unsaturated dicarboxylic acid.

7. A photopolymerizable recording material as claimed in claim 6, wherein the oligomeric copolymer contains, as copolymerized units, from 55 to 95% by weight of dicyclopentadiene, from 5 to 45% by weight of maleic acid half esters and from 0 to 30% by weight of maleic anhydride.

8. A photopolymerizable recording material as claimed in claim 7, wherein the copolymer contains photopolymerizable ethylenic double bonds as further functional groups.

9. A photopolymerizable recording material as claimed in claim 8, which contains, as component (a), a copolymer which contains, as copolymerized units, from 60 to 80% by weight of one or more cyclopentadiene monomers and from 20 to 40% by weight of maleic anhydride, from 20 to 60% of the anhydride groups in the copolymer being semi-esterified with hydroxyalkyl (meth)acrylates.

10. A photopolymerizable recording material as claimed in claim 9, which contains, as component (a), a copolymer which is obtained by reacting an oligomeric copolymer, containing, as copolymerized units, one or more cyclopentadiene monomers and one or more anhydrides of an α, β-unsaturated dicarboxylic acid and/or half esters of such an acid, with a polyfunctional chain-lengthening agent.

11. A photopolymerizable recording material as claimed in claim 10, wherein the copolymer is obtained by reacting an oligomeric copolymer, consisting of from 55 to 95% by weight of one or more cyclopentadiene monomers and from 5 to 45% by weight of maleic anhydride and/or maleic acid half esters, with a polyhydric alcohol and/or a polyvalent amine.

12. A photopolymerizable recording material as claimed in claim 10, containing a di- or polyepoxide as an additive.

13. A photopolymerizable recording material as claimed in claim 11, containing a blocked di- or polyisocyanate as an additive.

14. A process for the production of a printing plate, wherein the photopolymerizable recording material defined in claim 12 is exposed imagewise to actinic light and then washed out with an aqueous alkaline developer.

15. A process for the production of a printing plate, in which a photopolymerizable recording material as defined in claim 12 or 13 is exposed imagewise to actinic light, washed out with an aqueous alkaline developer and then post-cured, by exposure to actinic light and/or by heating.

16. A photopolymerizable recording material as claimed in claim 6, which contains, as component (a), oligomeric copolymers having a mean molecular weight of from about 500 to 1000 which have been modified by incorporation of further functional groups.

17. A process for the production of a printing plate, in which a photopolymerizable recording material possessing a photopolymerizable copying layer (1) applied on a dimensionally stable base is exposed imagewise to actinic light, washed out with an aqueous alkaline developer and then post-cured, wherein a recording material as claimed in claim 16 is used, and post-curing is effected by exposure to actinic light and/or by heating.

* * * * *